(12) United States Patent
Acharya

(10) Patent No.: US 6,225,829 B1
(45) Date of Patent: May 1, 2001

(54) DEVICE SIGNATURE GENERATOR

(75) Inventor: Pramod Acharya, Vileparle (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/338,445

(22) Filed: Jun. 22, 1999

Related U.S. Application Data

(60) Provisional application No. 60/139,944, filed on Jun. 18, 1999.

(51) Int. Cl.$^7$ ................................................. H03K 19/094
(52) U.S. Cl. ............................................ 326/108; 326/109
(58) Field of Search ..................................... 326/108, 109

(56) References Cited

U.S. PATENT DOCUMENTS 5,218,241 * 6/1993 Kurozumi ............................ 307/443

* cited by examiner

Primary Examiner—David Nelms
Assistant Examiner—M. Tran
(74) Attorney, Agent, or Firm—Wade James Brady, III; Frederick J. Telecky, Jr.

(57) ABSTRACT

A circuit (100) for generating configurable device signatures is disclosed. The circuit (100) includes a combinatorial logic section (102) that receives a number of information signals, and according to the logic of the information signals, activates one of a number of configuration signals (CONFIG0–CONFIGn). The configuration signals (CONFIG0–CONFIGn) are received by a signature option section (200). The signature option section (200) includes a number of conductive options (210-0 to 210-n and 212) that enable a unique signature (SIG0–SIG15) to be generated in response to each of the configuration signals (CONFIG0–CONFIGn). In the preferred embodiment, the conductive options (210-0 to 210-n and 212) are configured by way of a final metallization layer option.

25 Claims, 4 Drawing Sheets

| CONFIGURATION SIGNAL | SIGNATURE |
|---|---|
| TYPE0  4M  5V  x8   (BOOT TOP) | 00 77 H |
| TYPE0  4M  5V  x8   (BOOT BOTTOM) | 00 78 H |
| TYPE0  4M  5V  x16  (BOOT TOP) | 44 71 H |
| TYPE0  4M  5V  x16  (BOOT BOTTOM) | 44 72 H |
| TYPE0  4M  3V  x16  (BOOT TOP) | 88 93 H |
| TYPE0  4M  3V  x16  (BOOT BOTTOM) | 88 94 H |
| TYPE1  4M  5V  x16  (BOOT TOP) | 22 22 H |
| TYPE1  4M  5V  x16  (BOOT BOTTOM) | 22 AA H |
|  |  |
| MFG0 | 00 88 H |
| MFG1 | 00 02 H |
| MFG2 | 00 96 H |

DEVICE SIGNATURE GENERATOR

This application claims priority under 35 USC §119 (a) of Indian Application Number 1380/MAS/98, filed Jun. 23, 1998. This application claims priority under 35 USC 119(e)(1) of provisional application Ser. No. 60/139,944, filed Jun. 18, 1999.

TECHNICAL FIELD

The present invention relates generally to integrated circuits, and more particularly to circuits that provide configuration and identification information for semiconductor devices.

BACKGROUND OF THE INVENTION

While electronic systems continue to proliferate in all aspects of society, the various components that make up such systems are subject to some variation. This variation arises out of products that provide the same general function, but according to different standards. For example, while electrically programmable read only memories (EEPROMs) have the general function of storing data in a nonvolatile fashion, EEPROMs may have different storage capacities and/or be accessed in differing fashions. The input/output (I/O) bit widths may vary, with some EEPROMs providing data in eight-bit bytes, and others providing data in sixteen-bit words. In addition, according to different standards, portions of the memory may require special procedures to program and/or erase the memory cells within. To add to the many types of EEPROM configurations, power supply voltages may also vary. While some EEPROM may be designed to operate at three volts, others may require a five volt power supply.

In order to accommodate various standards and configurations, it is desirable to provide semiconductor devices that can be altered to operate according to one of a number of different standards. For example, while an EEPROM may have a certain capacity, the device could be altered during manufacturing to provide an eight bit or sixteen bit output. Furthermore, other variations could be implemented from one basic starting design. While external markings on the package of a device may provide the information necessary to identify the configuration, it is also desirable to provide device information in electronic form. Such device information is typically provided by applying a particular set of control signals to a semiconductor device, and reading the resulting output bits at certain pins. Such information is often referred to as a device "signature."

Semiconductor devices typically provide unique signature information, such as a device identification (ID) code and/or a manufacturer identification code. The device ID code can be used to indicate the various features of the semiconductor device. In the case of an EEPROM, the device signature can be read by the system, and the system can thereby know critical information about the EEPROM's operation.

A drawback to providing one particular device signature for a semiconductor device is that it may be desirable to utilize a basic design, and then customize that design to provide a number of devices having different functions. In such a case, each different device would have to be designed to provide a different device signature.

Another drawback to singular device signatures, is that some systems, although capable of functioning with a variety of devices, may be designed to expect a particular device signature. Thus, although a semiconductor device could operate within the system, due to its incompatible device signature, this is not possible.

For semiconductor devices in rapidly evolving markets, a singular device signature is also a drawback. As new variations to existing devices are developed, new device signatures may be required.

It would be desirable to provide some way of introducing greater flexibility into manner in which a device signature is provided by a semiconductor device.

SUMMARY OF THE INVENTION

According to the preferred embodiment, a device signature circuit is capable of providing any of a number of device signatures based upon device information signals. Furthermore, the device signatures are customizable by way of a number of conductive options. In the preferred embodiment, the conductive options are established by a metallization option.

According to one aspect of the preferred embodiment, the device signature circuit includes a combinatorial logic section that receives the information signals and activates a selected configuration signal in response thereto. The configuration signals are received by a signature option section that provides a unique device signature for each configuration signal. The unique device signatures are established by enabling, or alternately, disabling conductive options.

According to another aspect of the preferred embodiment, the signature option section includes a select bank corresponding to each bit of the device signature. Each select bank receives the configuration signals, and includes a conductive option and a select device associated with each configuration signal. The select banks further include a select node that establishes the logic of the signature bit. The select node is placed at a first logic state by a charge device. In the event a configuration signal is active, and its associated conductive option is enabled, the charge node will transition to a second logic state.

According to another aspect of the preferred embodiment, the conductive options are established by the last metallization layer in the semiconductor device manufacturing process.

An advantage of the preferred embodiment is that it provides a way of generating a number of device signatures according to device information.

Another advantage of the preferred embodiment is that when the conductive options are established by a last metallization layer, the device signatures can be customized with relative ease.

DETAILED DESCRIPTION OF THE EMBODIMENTS

The preferred embodiment is a circuit that provides customizable device signatures based upon device configuration information. The signatures are customizable, in that any of the signatures may be changed by using a metal layer option. The preferred embodiment may be implemented in an electrically erasable and programmable read only memory (EEPROM) to provide both a device identification (ID) and a manufacturer-equivalent identification (ID). The device ID indicates a particular architecture type, device capacity, operating voltage and input/output (I/O) bit width. The manufacturer-equivalent ID indicates which manufacturer (or manufacturers) that the EEPROM is compatible with.

Figures 1, 4:
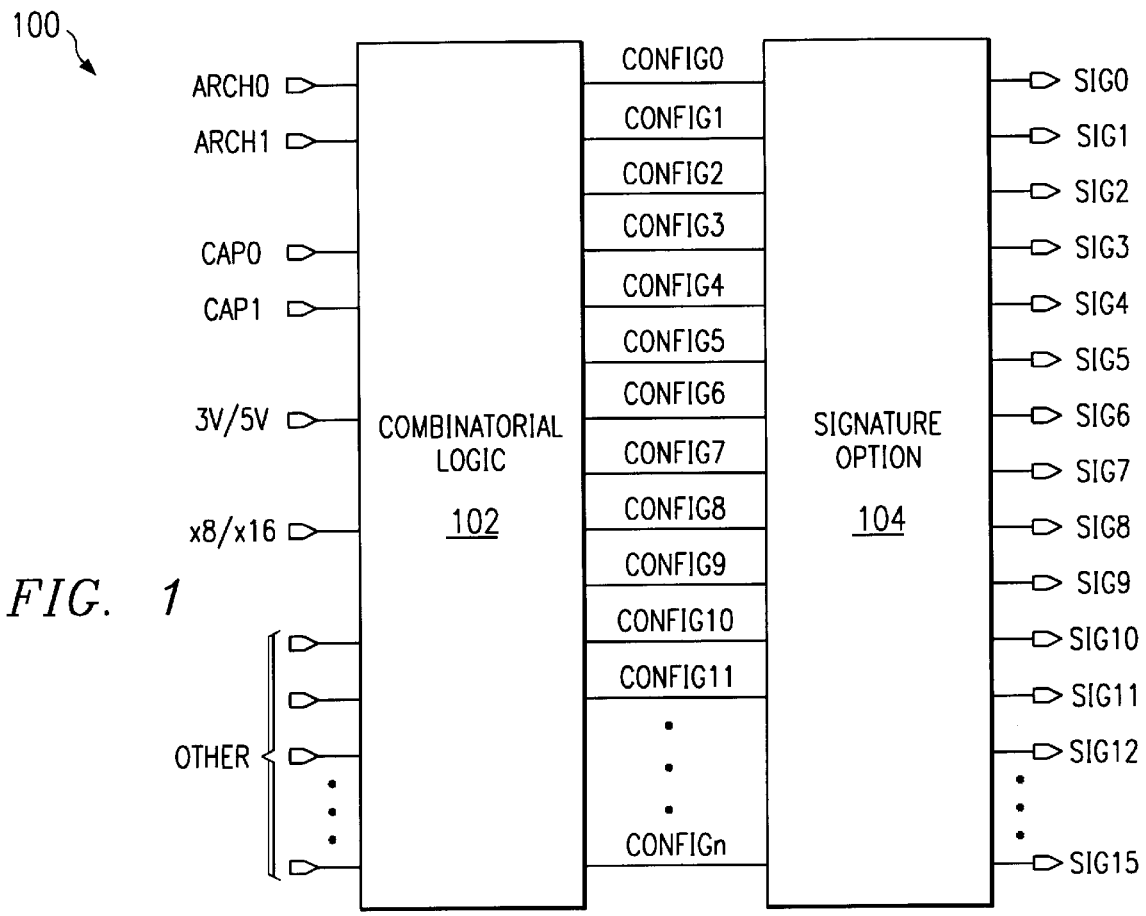
FIG. 1 is a block schematic diagram illustrating a preferred embodiment.
FIG. 4 is a table illustrating the resulting device signatures from the example set forth in FIG. 3.

Referring now to FIG. 1, the preferred embodiment is set forth in a block schematic diagram, and designated by the general reference character 100. The preferred embodiment 100 includes a combinatorial logic section 102 and a signature option section 104. The combinatorial logic section 102 receives a number of information signals that represent various aspects of a semiconductor device's configuration. In the preferred embodiment 100, device architecture information is provided by two signals, ARCH0 and ARCH1. The architecture information can indicate a particular EEPROM standard. As just one example, the ARCH0 and ARCH1 signals can indicate a particular programming and/or erase algorithm that is to be used with the EEPROM, and/or whether or not the EEPROM is divided into equally sized, or differently sized sectors. Furthermore, the ARCH0 and ARCH1 signals could also identify if a particular sector is a "boot" sector (requires specialized procedures for program and erase operations on the sector).

The other information signals received by the preferred embodiment include two capacity signals, shown as CAP0 and CAP1, an operating voltage signal, shown as 3V/5V, and an I/O width signal, shown as "×8/×16." The various combinations of capacity signals (CAP0 and CAP1) indicate the storage capacity of a semiconductor device, and in the preferred embodiment, will indicate a two, four, eight or sixteen megabit (Mb) capacity. The operating voltage signal will indicate whether a semiconductor device is designed to operate with a five volt or three volt power supply voltage. The ×8/×16 signal indicates how data is accessed in a semiconductor device. In the preferred embodiment, this signal indicates byte-wise (eight bit) or word-wise (sixteen bit) access.

The preferred embodiment is intended to be expandable to accommodate additional information signals beyond those described above. Accordingly, a number of unidentified information signals, collectively identified as OTHER, are shown as inputs to the combinatorial logic section 102.

The combinatorial logic section 102 provides configurations signals (CONFIG0–CONFIGn) that represent predetermined combinations of information signals (ARCH0–ARCH1, CAP0–CAP1, 3V/5V, and ×8/×16). The number of configuration signals (CONFIG0–CONFIGn) provided varies according to the number variations of the semiconductor device that are anticipated. The combinatorial logic section 102 can employ well-known logic circuits to activate the configuration signals. Thus, rather than provide a single device signature, the preferred embodiment utilizes device information signals to activate one of a number of possible configuration signals.

The signature option section 104 receives each of the configuration signals (CONFIG0–CONFIGn), and in response thereto, provides a unique device signature composed of a number of signature bits. In the preferred embodiment, the device signature includes sixteen bits shown as (SIG0–SIG15) in FIG. 1. The signature option section 104 provides greater flexibility in accommodating different signature requirements by enabling any of the signatures to be altered with a "metal" option. That is, only one fabrication step is required to establish a given signature or set of signatures. In this manner, in event signatures change, or need to be changed, this can be accomplished with relative ease. Such an approach enables a number of devices to be fabricated up to a certain point using a basic design. These devices can then be altered to provide differing functions. A last metallization step can then be used to establish the necessary device signatures.

Figure 2:
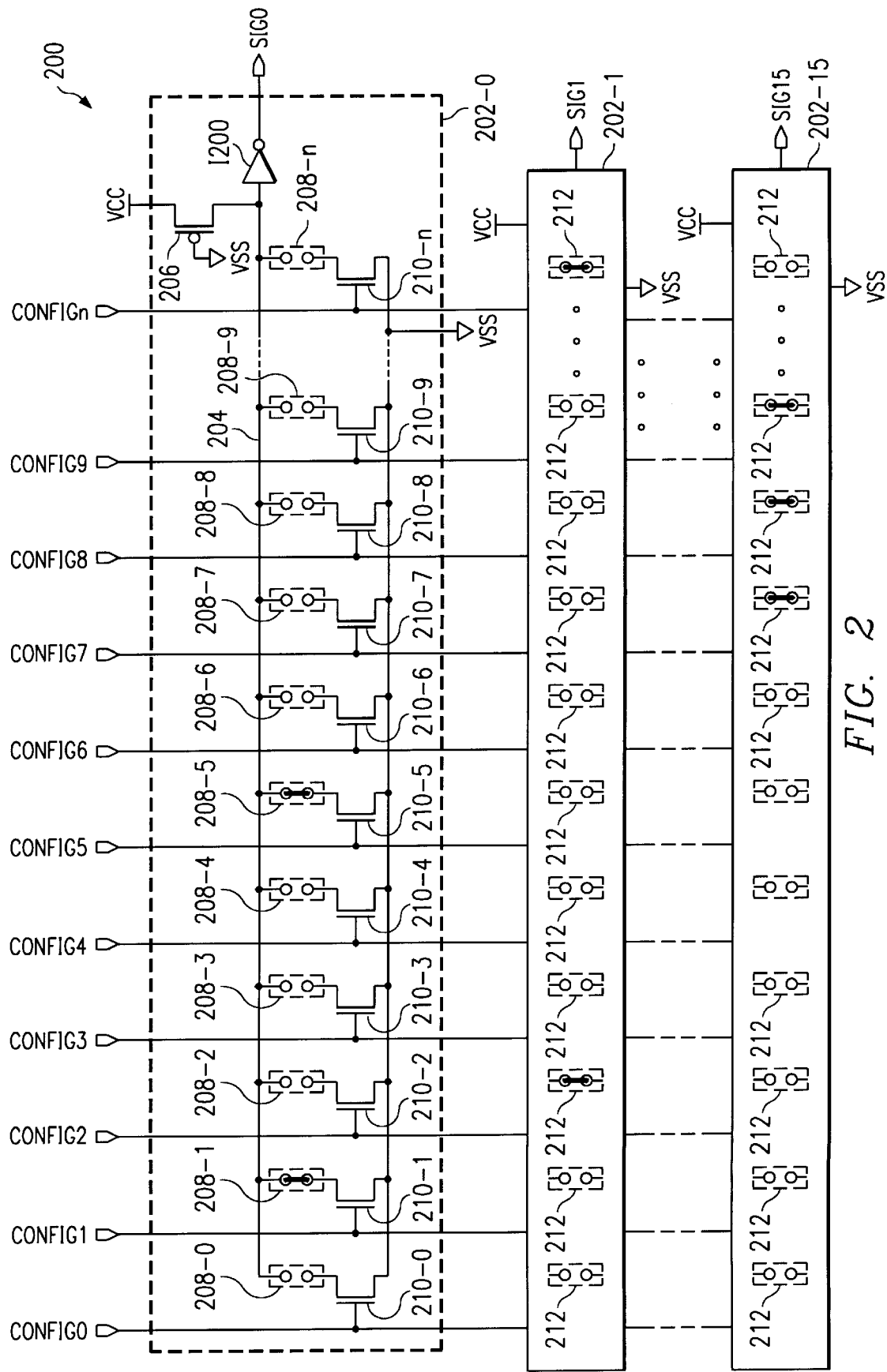
FIG. 2 is detailed schematic diagram of a signature option section according to a preferred embodiment.

Referring now to FIG. 2, a detailed schematic diagram is set forth illustrating a signature option section according to a preferred embodiment. The signature option section is designated by the general reference character 200, and may be used as the signature option section shown as item 104 in FIG. 1. The preferred signature option section 200 is shown to include a number of select banks, shown as 202-0 to 202-15. Each select bank (202-0 to 202-15) receives the configuration signals (CONFIG0–CONFIGn), and response thereto, activates one of the signature bits (SIG0–SIG15).

Three select banks are shown in FIG. 2; select banks 202-0, 202-1, and 202-15. Of the three select banks (202-0, 202-1, and 202-15) only select bank 202-0 is shown in detail. Select bank 202-0 is shown to include a select node 204, and a charge device 206 coupled between the select node 204 and a first power supply voltage (VCC). The charge device 206, when activated, serves to establish a first logic value (in this case a high logic value) at the select node 204. The preferred embodiment charge device 206 is shown to be a p-channel metal(conductor)-oxide(insulator)-semiconductor (MOS) transistors, having a source-drain path coupled between the high power supply voltage (VCC) and the select node 204. The gate of the p-channel transistor is coupled to a low power supply voltage (VSS). Thus, in the preferred embodiment, the charge device 206 can be considered to always be activated. Of course, the charge device could be temporarily activated by a precharge pulse or the like.

Select bank 202-0 is shown to further include a number of conductive options (208-0 to 208-n), each arranged in series with an associated select device (210-0 to 210-n). The conductive option/select device combinations (208-0/210-0 to 208-n/210-n) are each associated with one of the configuration signals (CONFIG0–CONFIGn). Each conductive option (208-0 to 208-n) serves to establish a second logic value (in this case a logic low value) at the select node 204 when its associated configuration signal (CONFIG0–CONFIGn) is activated, and its configuration option (208-0 to 208-n) is enabled.

Each conductive option (208-0 to 208-n) can be formed in a conductive or nonconductive state. The state of the conductive option (208-0 to 208-n) will determine whether or not its associated configuration signals (CONFIG0–CONFIGn) will cause a logic transition at the select node 204. In the preferred embodiment, the conductive options (208-0 to 208-n) are "last" metallization layer options. That is, if the semiconductor device is fabricated with two polysilicon layers and two metal layers, the conductive options (208-0 to 208-n) would be formed with the second metal layer. The second metal layer is patterned to form conductive options that are continuous (enabled) or discontinuous (disabled). In this manner, each conductive option (208-0 to 208-n) can be considered as providing an option path having a conductive or non-conductive state.

In the preferred embodiment, the select devices (210-0 to 210-n) are n-channel MOS transistors, having source-drain paths coupled between their respective conductive option (208-0 to 208-n) and the low power supply voltage VSS. The gate of each select device transistor is coupled to one of the configuration signals (CONFIG0–CONFIGn).

In FIG. 2, conductive options 208-1 and 208-5 are shown to be enabled (in a conductive state). In this configuration, an active (high) CONFIG1 or CONFIG5 signal will result in the select node 204 being driven low. The select bank 202-0 further includes a buffer inverter I200 for inverting the select node 204 to generate the signature bit SIG0. Thus, for the select bank 202-0, when the CONFIG1 or CONFIG5 signals are high, the resulting low at select node 204 will force the SIG0 bit high.

In order to induce a relatively rapid transition at the select node 204, the p-channel MOS transistor of the charge device 206 has a smaller width-to-length ratio than the n-channel MOS transistors of each of the select devices (210-0 to 210-n). In the preferred embodiment, the charge device transistor has a width-to-length ratio of 0.9/4, while the select device transistors have identical sizing ratios of 0.9/1.4.

In the preferred embodiment, the select banks (202-0 to 202-n) have the same configuration. Thus, although select banks 202-1 and 202-n are shown as block diagrams, it is understood that they will have the same general arrangement as select bank 202-0, with the exception being that the combination of conductive options that are enabled may vary according to the desired signature. To illustrate this point, the conductive options for select banks 202-1 and 202-15 are shown as items 212 in FIG. 2. With the option arrangement of select bank 202-1, a high CONFIG2 or CONFIGn signal will result in the SIG1 signature bit going high. Similarly, for select bank 202-15, a high CONFIG7, CONFIG8 or CONFIG9 signal will result in the SIG15 bit going high. In this manner, particular conductive options within each select bank (202-0 to 202-n) are enabled to generate a signature (SIG0-SIGn) corresponding to each configuration signal (CONFIG0–CONFIGn).

The conductive options (208-0 to 208-n and 212) can be considered to be logically organized into select groups. Each conductive option (208-0 to 208-n and 212) in a select group is coupled to the same select node 204. Thus, in FIG. 2, the conductive options (208-0 to 208-n and 212) within the same select bank (202-0 to 202-15) belong to the same select group.

The conductive options (208-0 to 208-n and 212) can be considered to be further divided, in a logical manner, into signature groups. Those conductive options (208-0 to 208-n and 212) within the same signature group are coupled to the same associated configuration signal (CONFIG0–CONFIGn). Accordingly, conductive option 208-0 can be considered to be in a signature group corresponding to the signal CONFIG0. This same signature group would include the left-most conductive options 212 of select banks 202-1 and 202-15, shown in FIG. 2. The conductive options of the same signature group establish the signature of the associated configuration signal (CONFIG0–CONFIGn).

Because each select devices (210-0 to 210-n) in FIG. 2 is coupled to an associated conductive option (208-0 to 208-n and 212), the select devices can also be considered to be logically grouped into corresponding select groups and signature groups.

Figure 3:
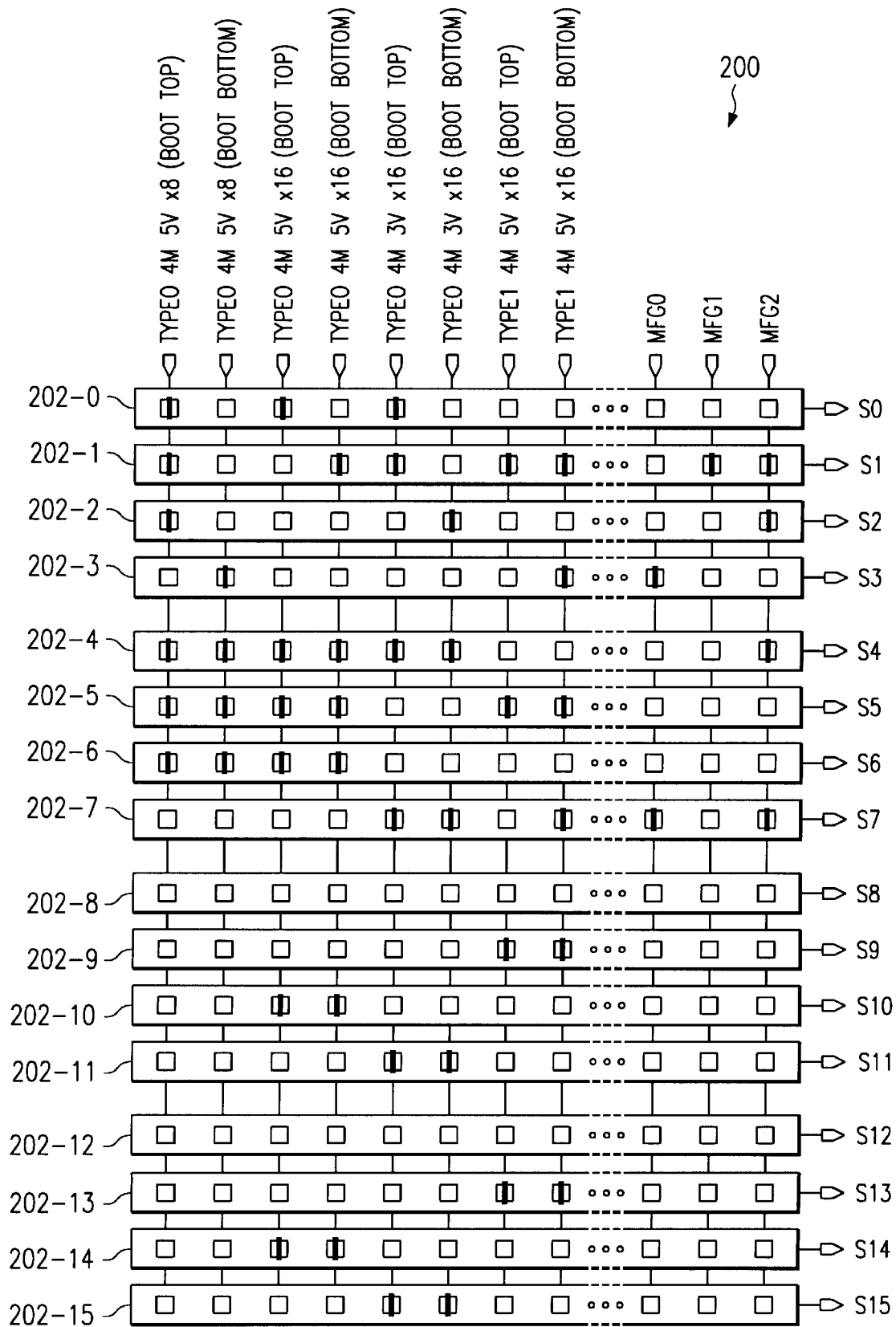
FIG. 3 is block diagram illustrating one example of a conductive option configuration.

Referring now to FIG. 3, a particular example of a conductive option configuration is set forth. In the example of FIG. 3, eleven configuration signals are given specific identities. Eight of the configuration signals represent a device identification signature, and include five identifying fields. The first field indicates a particular device operating configuration, and is shown as "TYPE." In the case of an EEPROM, this field may be used to indicate particular procedures for programming and erasing cells within the EEPROM. The second field indicates storage capacity. In the particular example of FIG. 3, the configuration signals each indicate a four megabit capacity, thus the second field is shown as "4M." Additional configuration signals could indicate lower capacities (2M) or higher capacities (8M and/or 16M). The third field indicates operating voltage (i.e., 3 volts or 5 volts). The fourth field indicates the I/O bit width of the device, and indicates byte-wise data access (x8) or word-wise data access (x16). Finally, the configuration signals shown are each for a "boot block" EEPROM. In such a device, typically one portion of the device (either a top block or bottom block) receives some protection from standard programming and erase operations. Thus, the final field indicates if the top or bottom block is a "boot block."

In addition to the device identification configuration signals, three other configuration signals are shown as MFG0, MFG1 or MFG2. These configuration signals represent manufacturer equivalent signatures. The signatures generated by these signals will indicate that the device is manufactured to operate in an equivalent fashion to the manufacturer indicated by the code.

In FIG. 3, the select banks (202-0 to 202-15) are shown in block diagram form. The conductive options of each select bank (202-0 to 202-15) are represented as squares within a select bank. The status of the conductive option (i.e., conductive or not) is indicated by the presence or absence of a vertical line within the square. As will be recalled from FIG. 2, an enabled conductive option will generate a high signature bit (S0–S15) when its respective configuration signal is activated.

Referring now to FIG. 4, the signatures that result from of the example of FIG. 3 are set forth in a table. The signatures are shown in hexadecimal format for convenience. Thus, the configuration signal "TYPE0 4M 5V×8 (boot top)" will provide a signature of 0077 (hexadecimal) and the configuration signal "TYPE1 4M 5V×16 (boot top)" will provide a signature of 2222 H. In addition, the MFG1 configuration signal will provide a signature of 0002, and the MFG2 configuration signal will provide a signature of 0096.

In FIG. 3, the conductive options are shown to be organized into rows and columns. The conductive options of the same row are of the same select group. The conductive options of the same column are of the same signature group. It is understood that the row and column arrangement represents a logical organization, and not necessarily a physical organization.

It is understood that the particular example of FIG. 3 is just one embodiment. Additional device identification and/or manufacturer configuration signals could be provided, each with its own unique signature. Furthermore, while the preferred embodiment can be implemented in EEPROMs, the preferred embodiment could also be employed in other types of semiconductor devices to provide easily customizable signatures in response to a number of information signals.

Figure 5A:
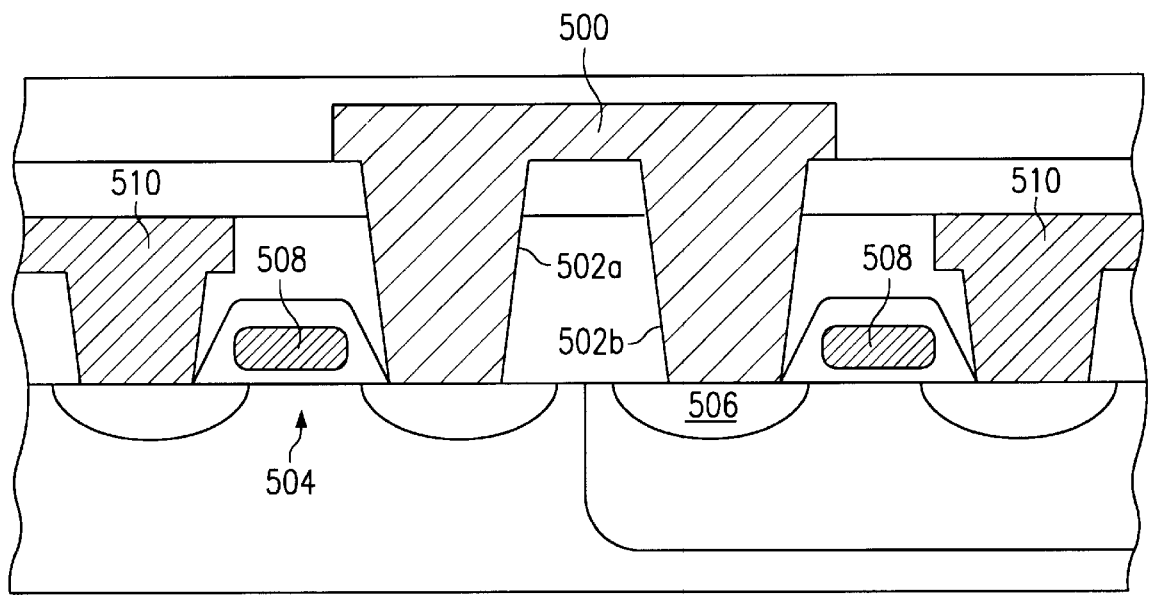
FIGS. 5A and 5B is a side cross sectional view illustrating an enabled and disabled conductive option according to a preferred embodiment.
Figure 5B:
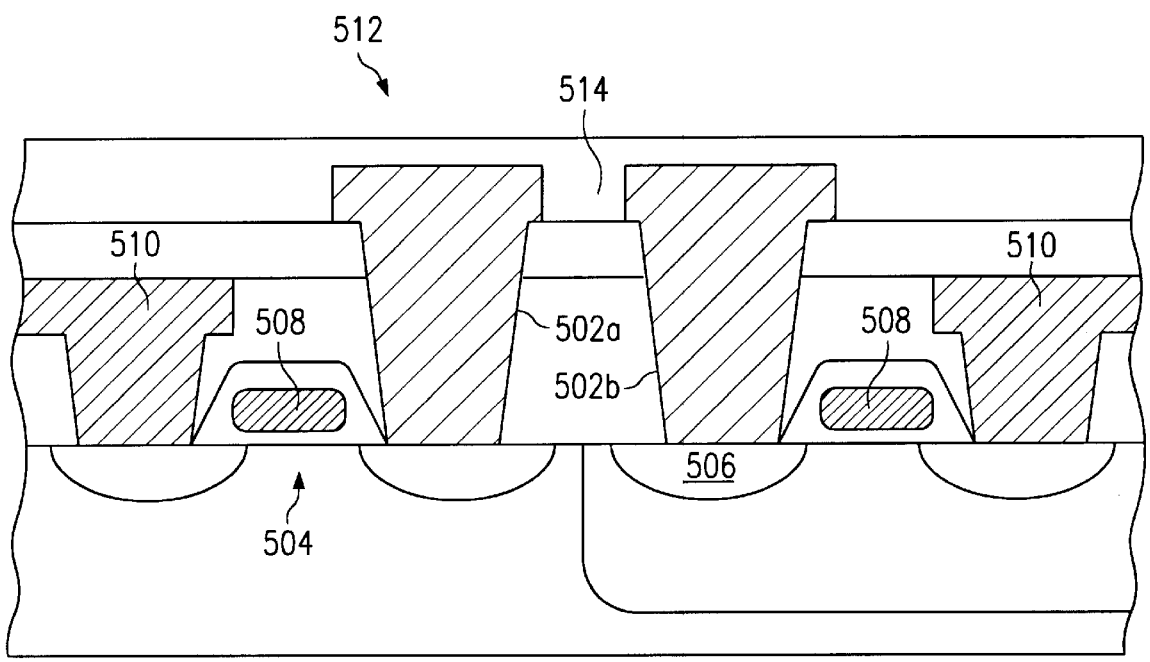

Referring now to FIGS. 5A and 5B, side cross sectional views are set forth illustrating one embodiment of a conductive option, in an enabled state and a disabled state. FIG. 5A illustrates a configuration option in the enabled state. The enabled configuration option is shown as item 500, and extends into contact holes 502a and 502b, to couple a select device 504 to a select node 506. The select device 504 can be considered to correspond to the select devices 210-0 to 210-n in FIG. 2, and the select node 506 can be considered to correspond to the select node 204 of FIG. 2. In the side cross sectional view of FIG. 5A, the semiconductor device includes a gate level conductive layer 508 (used to form the gates) and a lower metallization layer 510. The enabled conductive option 500 is formed from a "final" metallization layer (the last conductive layer to be deposited to form the semiconductor device). In this manner, the particular signatures generated by the semiconductor device can be reserved to one of the last fabrication steps. The conductive option 500 can be considered to include a first node (the select node 506) and a second node (the drain of select device 504).

FIG. 5B sets forth a disabled conductive option. In the particular embodiment of FIG. 5B, the disabled conductive option is shown as item 512. Unlike the enabled conductive option 500, the disabled conductive option 512 includes an opening 514. As a result, the select node 506 remains isolated from the select device 504, and will remain at a predetermined logic level by operation of a charge device.

It is understood that while the present invention has been described in terms of detailed preferred embodiments, various changes, substitutions, and alterations could be made without departing from the spirit and scope of the invention. Accordingly, the present invention is intended to be limited only as defined by the appended claims.

What is claimed is:

1. In a semiconductor device, a circuit for providing an alterable device signature, the circuit comprising:
    a logic section that receives a plurality of information signals and provides a plurality of configuration signals, the logic section activating selected configuration signals when selected combinations of information signals are activated; and
    a signature option section that includes a plurality of conductive options, each conductive option having an enabled state and a disabled state, the signature option section receiving the configuration signals and providing a signature corresponding to each configuration signal, the signature being dependent upon the state of selected of the conductive options, wherein:
    the signature includes a plurality of signature bits; and the signature option section includes a plurality of select banks, each select bank receiving the configuration signals and including a conductive option corresponding to each configuration signal, each select bank providing one of the signature bits, and activating its respective signature bit when a configuration signal is active and its corresponding conductive option is in the enabled state.

2. In a semiconductor device, a circuit for providing an alterable device signature, the circuit comprising:
    a logic section that receives a plurality of information signals and provides a plurality of configuration signals, the logic section activating selected configuration signals when selected combinations of information signals are activated; and
    a signature option section that includes a plurality of conductive options, each conductive option having an enabled state and a disabled state, the signature option section receiving the configuration signals and providing a signature corresponding to each configuration signal, the signature being dependent upon the state of selected of the conductive options, wherein:
    the signature includes a plurality of signature bits; and
    the signature option section includes a plurality of select banks, each select bank including
    a select node;
    a charge device that couples the select node to a first potential when enabled,
    the plurality of conductive options being coupled to the select node, and
    a plurality of select devices, each select device coupling a conductive option to a second potential when enabled, each select device being enabled by one of the configuration signals.

3. The circuit of claim 2, wherein:
the charge device includes a charge insulated gate field effect transistor (IGFET) having a source-drain path coupled between the select node and the first potential.

4. The circuit of claim 2, wherein:
the semiconductor device is fabricated using a plurality of patterned conductive layers, including a first deposited conductive layer and a last deposited conductive layer; and
the plurality conductive options, when enabled, are formed from the last deposited conductive layer.

5. The circuit of claim 2, wherein:
the enabled conductive options include a conductive layer that is continuous between a first node coupled to the select node and a second node coupled to one of the select devices; and
the disabled conductive options include a conductive layer that is discontinuous between a first node coupled to the select node and a second node coupled to one of the select devices.

6. The circuit of claim 2, wherein:
the select devices each include a select IGFET having a source-drain path coupled between the select node and the second potential, the gate of each select IGFET being coupled to one of the configuration signals.

7. A device signature generator, comprising:
a plurality of signature bits outputs;
a select node coupled to each signature bit output;
a plurality of select devices arranged into select groups, each select group being associated with one of the select nodes, one select device within each select group being activated by a particular configuration signal, and providing a conductive path to a second logic level when activated; and
a plurality of conductive options, each conductive option being disposed between one of the select devices and its associated select node, each conductive option being capable of having a conductive state or a non-conductive state.

8. The device signature generator of claim 7, wherein:
the plurality of select devices includes a plurality of select insulated gate field effect transistors (IGFET) arranged in parallel between the select node and the second logic level.

9. The device signature generator of claim 8, wherein:
each select IGFET has a gate coupled to a configuration signal.

10. The device signature generator of claim 8, wherein:
the plurality of select IGFETs are n-channel IGFETs.

11. The device signature generator of claim 10, further including:
a charge device coupled to each select node, each charge device including a p-channel IGFET having a source-drain path coupled between the select node and a first logic level.

12. The device signature generator of claim 7, further including:

a charge device coupled to each select node, each charge device providing a conductive path to a first logic level when activated.

13. The device signature generator of claim 7, wherein:

each conductive option is formed during a metallization step.

14. The device signature generator of claim 13, wherein:

the metallization step is a last metallization step.

15. An arrangement for providing a number of device signatures according device information, the arrangement comprising:

a plurality of configuration signal inputs;
a plurality of signature bit outputs;
a select node coupled to each signature bit output;
a plurality of conductive options, logically arranged into select groups and signature groups, the conductive options of the same signature group being commonly associated with one of the configuration signal inputs, the conductive options of the same select group being commonly coupled to an associated select node, each conductive option including an option path that is configurable to a conductive state or a non-conductive state; and
a select device coupled to each conductive option, each select device having a current path and a control node, the current path being enabled according to the potential at its respective control node, each select device having its control node coupled to one of the configuration signal inputs, and its current path coupled to the option path of its respective conductive option.

16. The arrangement of claim 15, wherein:

the number of conductive options within each signature group is equal to the number of signature bit outputs.

17. The arrangement of claim 15, wherein:

the number of conductive options within each select group is equal to the number of configuration signal inputs.

18. The arrangement of claim 15, wherein:

the conductive options within each select group are disposed in parallel between their associated select node and a second power supply voltage.

19. The arrangement of claim 18, further including:

a charge device associated with each select node, each charge device having a current path coupled between its associated select node and a first power supply voltage.

20. The arrangement of claim 15, wherein:

the select devices are logically arranged into select groups, each select device select group corresponding to one of the conductive option select groups.

21. The arrangement of claim 20, wherein:

the number of select devices within each select group is equal to the number of configuration signal inputs.

22. The arrangement of claim 20, wherein:

the select devices within each select group are disposed in parallel between one of the select nodes and a second power supply voltage.

23. The arrangement of claim 15, wherein:

the select devices are logically arranged into signature groups, each select device signature group corresponding to one of the conductive option signature groups, the control nodes of the select devices within the same signature group being commonly coupled to the same configuration signal input.

24. The arrangement of claim 23, wherein:

the number of select devices within each signature group is equal to the number of signature bit outputs.

25. In a semiconductor device, a circuit for providing an alterable device signature, the circuit comprising:

a logic section that receives a plurality of information signals and provides a plurality of configuration signals, the logic section activating selected configuration signals when selected combinations of information signals are activated; and a signature option section that includes a plurality of conductive options, each conductive option having one of an enabled state and a disabled state, each conductive option including a first and a second node, each conductive option having an enabled state including a conductive layer that is continuous between said first and second nodes, each conductive option having a disabled state including a conductive layer that is discontinuous between said first and second nodes, the signature option section providing a signature in response to said configuration signals, the signature being dependent upon the state of said conductive options.

* * * * *